United States Patent
Kung et al.

(10) Patent No.: US 6,779,783 B2
(45) Date of Patent: Aug. 24, 2004

(54) METHOD AND STRUCTURE FOR TAPE BALL GRID ARRAY PACKAGE

(75) Inventors: Chen-Yueh Kung, Taoyuan Hsien (TW); Kwun-Yao Ho, Taipei (TW); Jackie Fu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/068,276

(22) Filed: Feb. 6, 2002

(65) Prior Publication Data

US 2003/0100212 A1 May 29, 2003

(30) Foreign Application Priority Data

Nov. 27, 2001 (TW) ........................................ 90129240 A

(51) Int. Cl.[7] .................. H01L 23/48; H01L 23/52; H01L 29/40
(52) U.S. Cl. ................. 258/780; 257/702; 257/701; 257/737; 257/738; 257/774; 257/784; 257/787
(58) Field of Search ................. 257/780, 737, 257/738, 702, 701, 784, 787, 774

(56) References Cited

U.S. PATENT DOCUMENTS

| | | | | |
|---|---|---|---|---|
| 5,835,355 A | * | 11/1998 | Dordi | 361/760 |
| 5,866,949 A | * | 2/1999 | Schueller | 257/778 |
| 6,084,297 A | * | 7/2000 | Brooks et al. | 257/698 |
| 6,140,707 A | * | 10/2000 | Plepys et al. | 257/778 |

* cited by examiner

Primary Examiner—Eddie Lee
Assistant Examiner—Nitin Parekh
(74) Attorney, Agent, or Firm—J.C. Patents

(57) ABSTRACT

A tape ball grid array package and a method of fabricating the package. A dielectric tape having a metallic layer on both sides is provided. The metallic layers are patterned to form circuits. A plurality of via holes is formed in the dielectric tape. The via holes pass through the lower metallic layer and the tape dielectric but stop at the upper metallic layer, thereby forming a plurality of blind holes. A solder mask layer is formed over each side of the tape and the solder mask layers are patterned to expose a portion of the metallic layer serving as contact points for connecting with a chip. A solder ball is inserted into each blind hole. One end of the solder ball protrudes from the surface of the solder mask layer. Wire-bonding operation or flip-chip assembly process is conducted to form electrical connection between the chip and the contact points.

38 Claims, 6 Drawing Sheets

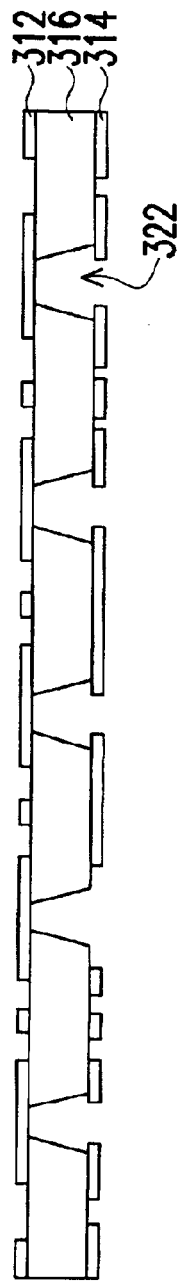
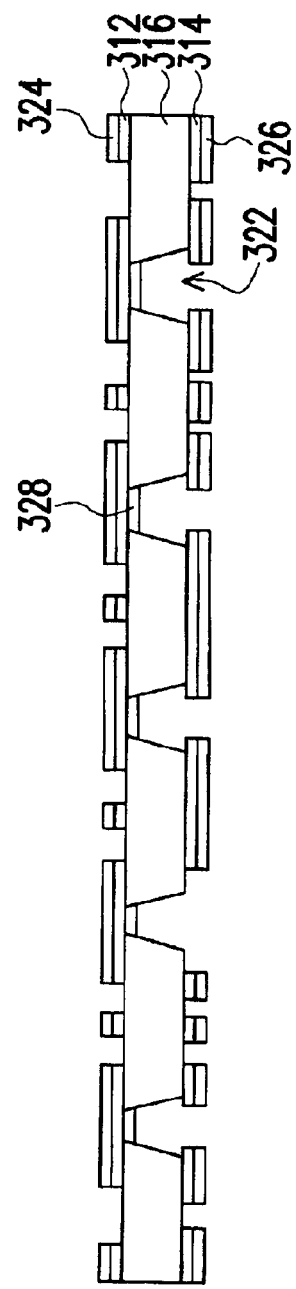
FIG. 2C
FIG. 2D

METHOD AND STRUCTURE FOR TAPE BALL GRID ARRAY PACKAGE

CROSS-REFERENCE TO RELATED APPLICATION

This application claims the priority benefit of Taiwan application serial no. 90129240, filed Nov. 27, 2001.

BACKGROUND OF THE INVENTION

1. Field of Invention

The present invention relates to a ball grid array package. More particularly, the present invention relates to a tape ball grid array (TBGA) package structure and corresponding method of manufacture.

2. Description of Related Art

Ball grid array (BGA) is a type of package that uses an array of solder balls on the bottom surface of a substrate to serve as leads instead of using a conventional lead frame. In general, bonding pads on a chip connect with corresponding connecting pads on the substrate by metallic wire or by forming a flip-chip structure. Through various internal trace lines, the connecting pads are connected to other contact points on the top surface of the substrate. By forming vias through the substrate, the contact points on the top surface of the substrate are electrically connected to contact points on the bottom surface of the substrate. The solder balls are attached to the contact points on the bottom surface of the substrate. Since a ball grid array (BGA) package can make use of the entire lower surface of the substrate for distributing the contact points, a high pin count package is conveniently fabricated. In addition, when the solder ball is heated to conduct a reflow operation, surface tension of the solder has a self-aligningcapability. Thus, the solder balls need not be accurately positioned. Furthermore, the reflow operation confers not only a high bonding strength to the solder balls, but also provides superior electrical connectivity.

Ball grid array packages may be classified into plastic-molded plastic ball grid array (PBGA) packages, ceramic-molded ceramic ball grid array (CBGA) packages and tape ball grid array (TBGA) packages having a circuit patterned tape for connecting with a chip. Among the three types of ball grid array packages, the tape ball grid array (TBGA) packages provide a higher pin count, a thinner and lighter package and has better electrical properties and heat dissipation capacity. The TBGA package is particularly suitable for housing an application specific integrated circuit (ASIC) or a microprocessor.

FIG. 1 is a cross-sectional view of a conventional tape ball grid array package. As shown in FIG. 1, the tape 110 of the tape ball grid array package 100 consists of a pair of copper foils 112 and 114, a dielectric layer 116 made from polyimid or other flexible resin sandwiched between. The copper foils 112 and 114 are patterned to form circuits. Furthermore, vias 118 are formed in the dielectric layer 116, and a solder mask layer 120 is patterned to expose a portion of the copper foil 114 that serves as solder ball pads 122. Solder balls 124 are mounted onto various solder ball pads 122. The die pads 202 on a chip 200 are connected to the circuit pattern on the copper foil 114 through conductive wires 126. The chip 200 is electrically connected to external devices via the patterned copper foil 114 and the solder balls 124.

The tape 110 is attached to the bottom surface of a stiffener 140 using adhesive 130a. The stiffener 140 is attached to the bottom surface of a heat sink 150 using adhesive 130b. Surrounded by the stiffener 140, the chip 200 is attached to the bottom of a heat sink 150 using adhesive 130. Note that the copper foil 112 on the upper surface of the tape 110 is a common ground or a power layer. To apply a ground voltage or power voltage to the copper foil 112 through a solder ball 124, vias 118 are formed in the dielectric layer 116 to connect the solder ball 124 to the copper foil 112 electrically. However, a number of additional steps and chemicals are needed to form the vias 118 in the dielectric layer 116 such as de-smearing and copper plating. These processes not only increase production cost, but also increase manufacturing time as well.

SUMMARY OF THE INVENTION

Accordingly, one object of the present invention is to provide a tape ball grid array (TBGA) package and a method of manufacturing the package that can simplify the number of processing steps, shorten the manufacturing time and lower the manufacturing cost.

To achieve these and other advantages and in accordance with the purpose of the invention, as embodied and broadly described herein, the invention provides a tape ball grid array package. The TBGA package has a tape comprising a dielectric layer, a first metallic layer and a second metallic layer. The dielectric layer has a plurality of via holes that pass through the dielectric layer. The first metallic layer is on one side of the dielectric layer and covers one end of the via holes to form a plurality of blind holes. The second metallic layer is on the other side of the dielectric layer and exposes the open end of the blind holes. A first solder mask layer is on top of the first metallic layer. The first solder mask layer exposes a portion of the first metallic layer and forms a plurality of contact points. In addition, a second solder mask layer is on top of the second metallic layer and exposes a portion of the second metallic layer and the other end of the blind holes. A solder ball is placed over the open end of each blind hole such that one end of the solder ball protrudes from the surface of the second solder mask layer. These solder balls connect electrically with the first metallic layer and at least one solder ball connects electrically with the second metallic layer. A chip is on the first surface of the dielectric layer, and the bonding pads on the chip connect electrically with the respective contact points on the first metallic layer.

This invention also provides a method of forming a tape ball grid array package. First, a tape comprising a dielectric layer, a first metallic layer and a second metallic layer is provided. The first metallic layer is on a first surface of the dielectric layer while the second metallic layer is on the other surface of the dielectric layer. The first metallic layer and the second metallic layer are patterned. A plurality of blind holes is formed in the tape such that the blind holes pass through the second metallic layer and the dielectric layer but stop at the first metallic layer. Ni/Au is plated on both first and second metallic layers. A first patterned solder mask layer and a second patterned solder mask layer are formed over the first metallic layer and the second metallic layer respectively. The first solder mask layer exposes a portion of the first metallic layer to form a plurality of contact points. The second solder mask layer exposes a portion of the second metallic layer and one end of the blind holes. A solder ball is placed over the open end of each blind hole such that one end of the solder ball protrudes above the outer surface of the second solder mask layer. These solder balls connect electrically with the first metallic layer, and at least one solder ball connects electrically with the second metallic layer. A chip is attached to the first surface of the dielectric layer, and the bonding pads on the chip are electrically connected to the respective contact points on the first metallic layer by wire-bonding or flip-chip attachment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A–2H are schematic cross-sectional views showing the progression of steps for fabricating a tape ball grid array package according to one preferred embodiment of this invention.

DESCRIPTION OF THE PREFERRED EMBODIMENTS

Figure 1:
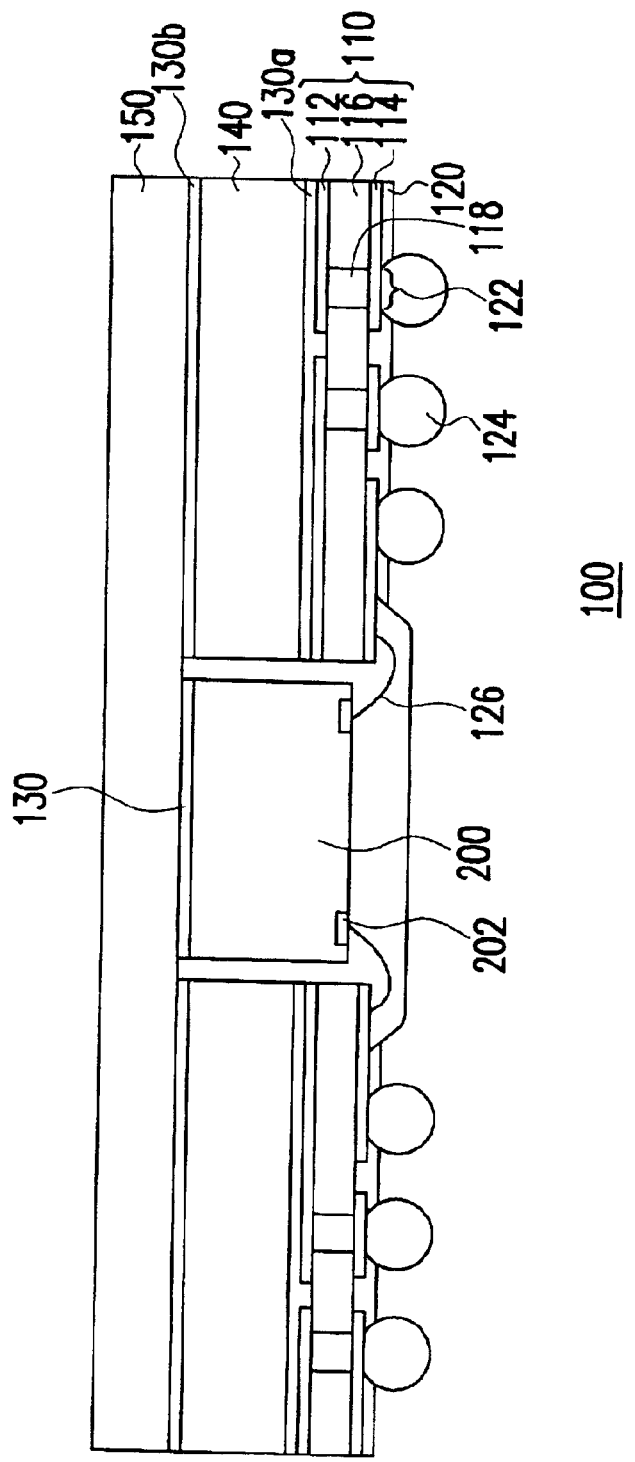
FIG. 1 is a cross-sectional view of a conventional tape ball grid array package.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
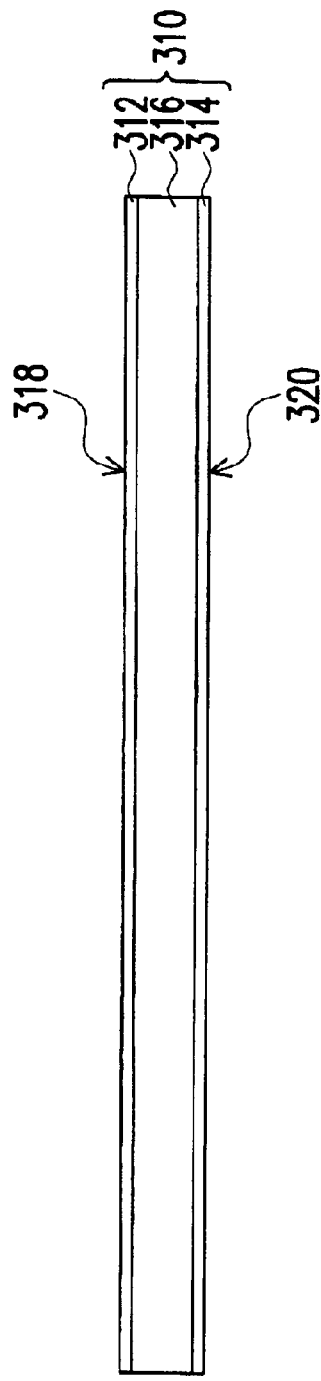

FIGS. 2A–2H are schematic cross-sectional views showing the progression of steps for fabricating a tape ball grid array package according to one preferred embodiment of this invention. As shown in FIG. 2A, a tape 310 comprising of a dielectric layer 316 sandwiched between two metallic layers 312, 314 is provided. The metallic layer 312 is formed on a first side 318 of the dielectric layer 316 while the metallic layer 314 is formed on a second side 320 of the dielectric layer 316. The dielectric layer 316 can be a polyimide layer or other flexible resin, and the metallic layers 312, 314 can be copper layers, for example.

Figure 2B:
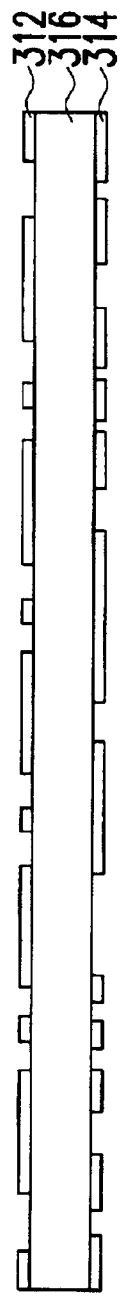

As shown in FIG. 2B, the metallic layers 312 and 314 are separately patterned to form circuits. The patterning may include photolithographic and etching processes. As shown in FIG. 2C, a plurality of via holes 322 is formed in the dielectric layer 316. The via holes 322 are formed, for example, by photolithographic process or laser ablation followed or plasma etching. The via holes 322 pass through the metallic layer 314 and the dielectric layer 316 but stop at the metallic layer 312.

Figure 2E:
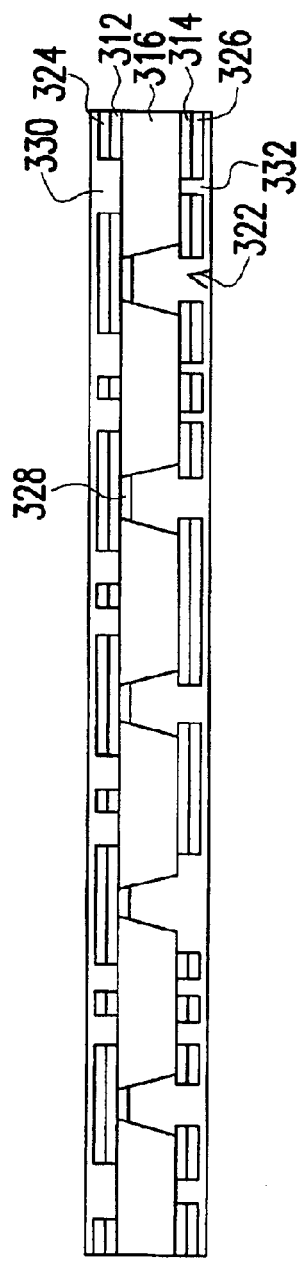
Figure 2F:
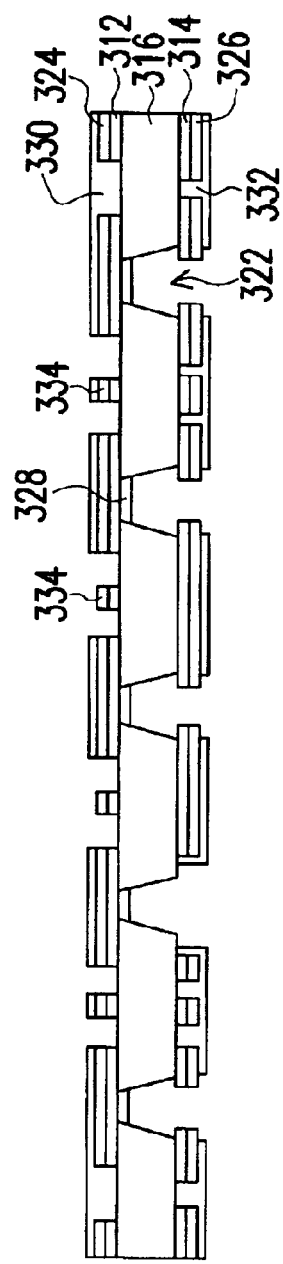

As shown in FIG. 2D, patterned alloy layers 324 and 326 are formed over the metallic layer 312 and the metallic layer 314 respectively. The patterned alloy layers 324 and 326 are formed, for example, by electroplating, chemical plating or electroless plating. Since a portion of the metallic layer 312 is exposed by the via holes 322, an alloy layer 328 is also formed on the bottom surface of the metallic layer 312. The alloy layers 324, 326 and 328 can be made using nickel-gold alloy, for example, to protect metallic layers from oxidation and provide optimum surface for soldering. As shown in FIG. 2E, solder mask layers 330 and 332 are coated over the alloy layers 324, 326, 328, the metallic layers 312, 314 and the dielectric layer 316. As shown in FIG. 2F, the solder mask layers 330 is patterned so that the solder mask layer 330 exposes a portion of the alloy layer 324 to form a plurality of contact points 334. Similarly, the solder mask layer 332 is patterned so that the solder mask layer 332 exposes a portion of the alloy layer 326 and the alloy layer 328. The solder mask layers 330 and 332 are patterned by photo-exposure and subsequent chemical development, for example.

Figure 2G:
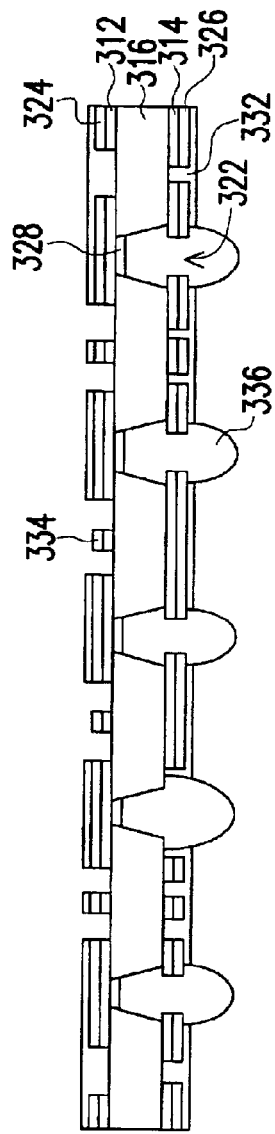
Figure 2H:
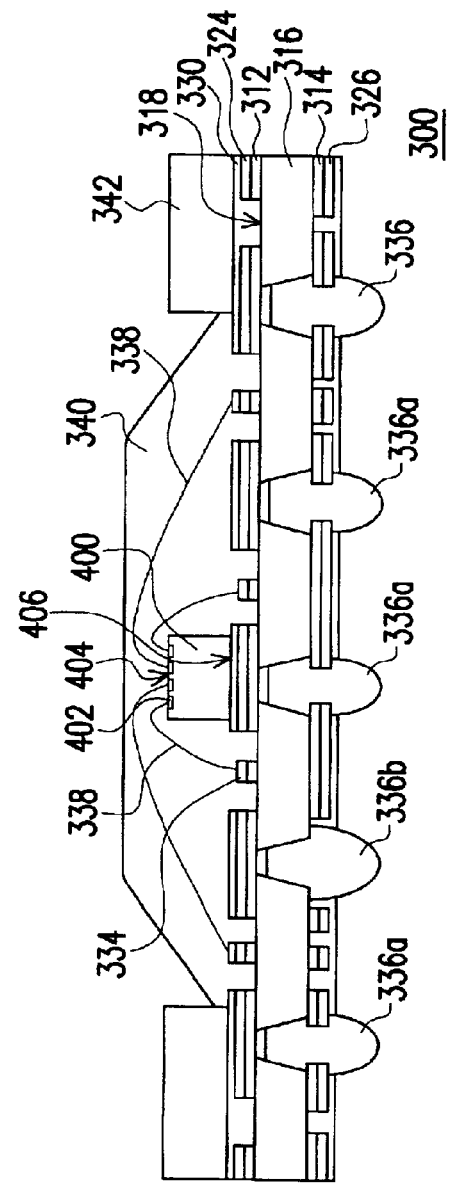

As shown in FIG. 2G, a solder ball 336 is planted into each via hole 322 such that the lower end of each solder ball 336 sticks out from bottom surface of the solder mask layer 332. The upper end of the solder ball 336 is in electrical contact with the bottom surface of the metallic layer 312 via the alloy layer 328 while a portion of the solder ball 336 is in contact with the metallic layer 314 and alloy layer 326. As shown in FIG. 2H, the backside 406 of a chip 400 is attached to the first side 318 of the dielectric layer 316. The chip 400 has an active surface 404 with a plurality of bonding pads 402 thereon. The bonding pads 402 and the contact points 334 are electrically connected through conductive wires 338 formed in a wire-bonding operation. Hence, the chip 400 is able to communicate with an external device through the conductive wires 338, the metallic layer 312 and the solder balls 336. Finally, the chip 400, the conductive wires 338, and the contact points 334 are enclosed using a plastic material 340, thereby forming a complete tape ball grid array package 300. To increase hardness and planarity of the package, a stiffener 342 may be added. The stiffener 342 preferably surrounds the chip 400 and attaches to the upper surface of the solder mask layer 330. The stiffener 342 can be a solder-plated copper plate, for example.

In FIG. 2H, when the metallic layer 314 serves as a common ground or a power source layer, both the metallic layer 312 and the metallic layer 314 may be connected during the solder ball implant 336a. Hence, there is no need to carry out special steps for vias treatment (118 in FIG. 1). In other words, many treatment steps for forming the vias can be eliminated, thereby simplifying package production and shortening fabrication time. Note that the copper foil 112 further away from the solder balls 124 as shown in FIG. 1 serves as a power/ground layer. In this invention, however, the metallic layer 314 closer to the solder balls 336 serves as the power/ground layer while the metallic layer 312 further from the solder balls 336 serves as a signal layer. This is also one of the advantages in this invention.

Aside from wire-bonding to form electrical connection between the chip and the metallic circuits within the tape, the bumps on a chip may bond directly with the contact points on the tape in a flip-chip design.

Figure 3:
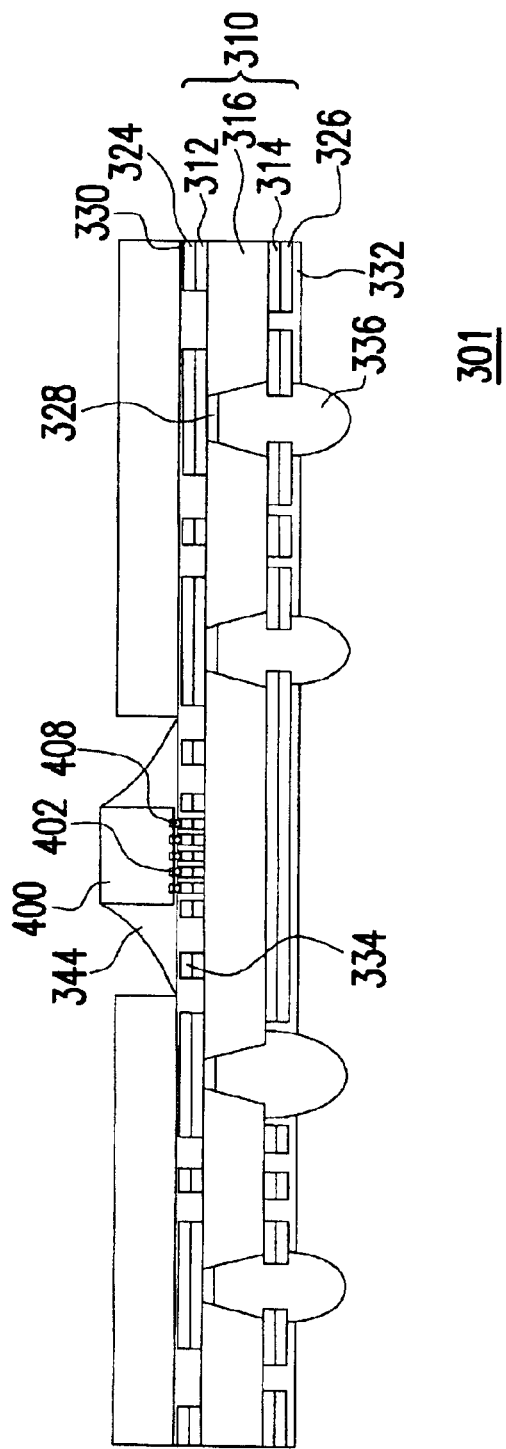
FIG. 3 is a schematic cross-sectional view of a tape ball grid array package fabricated according to another preferred embodiment of this invention.

FIG. 3 is a schematic cross-sectional view of a tape ball grid array package fabricated according to one preferred embodiment of this invention. The tape ball grid array package 301 having a tape 310 with multiple contact points 334, solder balls 336 and solder mask layers 330 and 332 shown in FIG. 3 may be fabricated using the steps already described with reference to FIGS. 2A–2G. Besides nickel-gold alloy, the alloy layers 324 and 326 may be fabricated using lead-tin alloy. Furthermore, bumps 408 may be formed over the bonding pads 402 of the chip 400 so that the bumps 408 correspond in position to the contact points 334. Hence, the chip 400 may communicate electrically with an external device via the bumps 408, the metallic layer 312 and the solder balls 336. In addition, underfill material 344 may be used to enclose the bonding pads 402, the bumps 408 and the contact points 334 so that the package is further protected.

In this invention, the metallic layers on each side of a dielectric layer of the tape are patterned to from circuits before forming via holes in the dielectric layer of the tape. Since the via holes pass through the lower metallic layer and the dielectric layer of the tape and stop at the upper metallic layer, blind holes for planting solder balls are formed. Thereafter, solder mask layers are formed on each side of the tape and patterned to expose a portion of the metallic layers serving as contact points. Solder balls are then planted into the blind holes with one end protruding outside the solder mask layer. Finally, the chip connects electrically with the contact points on the tape by wires or bumps in a flip-chip design.

In summary, the tape ball grid array package according to this invention eliminates the conventional via formation process by the insertion of solder balls through a blind hole. The solder balls not only protrude above the solder mask layer but also serve as an electrical medium for connecting circuits on both sides of the tape. Ultimately, the tape ball grid array of this invention is able to simplify processing, shorten production cycles and lower production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tape ball grid array package, comprising:
    a tape having:
        a dielectric layer having a first side, a second side and a plurality of via holes that pass through the dielectric layer;
        a patterned first metallic layer over the first side of the dielectric layer such that one end of the via holes is closed to form a plurality of blind holes;
        a patterned second metallic layer over the second side of the dielectric layer exposing the open end of the blind holes;
        a patterned first solder mask layer over the first metallic layer exposing a portion of the first metallic layer to serve as a plurality of contact points;
        a patterned second solder mask layer over the second metallic layer exposing a portion of the second metallic layer and the open end of the blind holes;
        a plurality of solder balls inserted into the blind holes with one end of the solder balls protruding out from the surface of the second solder mask layer, wherein the solder balls and the first metallic layer are electrically connected while at least one solder ball and the second metallic layer are electrically connected such that portions of the second metallic layer are circularly embedded in the solder ball; and
    at least one chip over the first side of the tape, wherein the chip connects electrically with various contact points on the tape.

2. The package of claim 1, wherein material constituting the dielectric layer includes polyimide.

3. The package of claim 1, wherein the second metallic layer serves as a power source layer or a ground layer.

4. The package of claim 1, wherein the first metallic layer serves as a signal transmission layer.

5. The package of claim 1, wherein material constituting the first metallic layer and the second metallic layer includes copper.

6. The package of claim 1, wherein the upper surface and the lower surface of the first metallic layer as well as the upper surface of the second metallic layer further include metallic alloy layers.

7. The package of claim 6, wherein material constituting the metallic alloy layer includes nickel-gold or lead-tin alloy.

8. The package of claim 1, wherein the chip has an active surface and a back surface, and the active surface of the chip further includes a plurality of bonding pads.

9. The package of claim 8, wherein the package further includes a plurality of conductive wires and packaging material, wherein the backside of the chip is attached to the first solder mask layer, the conductive wires connect the bonding pads with corresponding contact points on the tape, and the packaging material encloses the chip, the conductive wires and the contact points.

10. The package of claim 9, wherein the package further includes a stiffener on the first solder mask layer surrounding the packaging material.

11. The package of claim 8, wherein the chip further includes a plurality of bumps protruding from the bonding pads, and the bumps correspond in position to various contact points.

12. The package of claim 11, wherein the package further includes underfilling material that encloses the bonding pads, the bumps and the contact points.

13. The package of claim 11, wherein the package further includes a stiffener on the first solder mask layer and surrounds the chip.

14. A tape ball grid array package, comprising:
    a tape having:
        a dielectric layer having a first side, a second side and a plurality of via holes that pass through the dielectric layer;
        a patterned first metallic layer over the first side of the dielectric layer such that one end of the via holes is closed to form a plurality of blind holes, wherein the first metallic layer serves as a signal transmission layer;
        a patterned second metallic layer over the second side of the dielectric layer exposing the open end of the blind holes, wherein the second metallic layer serves as a power source layer or a ground layer;
        a patterned first solder mask layer over the first metallic layer exposing a portion of the first metallic layer to serve as a plurality of contact points;
        a patterned second solder mask layer over the second metallic layer exposing a portion of the second metallic layer and the open end of the blind holes;
        a plurality of first solder balls inserted into a portion of the blind holes with one end of the first solder balls protruding out from the surface of the second solder mask layer, wherein the first solder balls are electrically connected with the first metallic layer;
        a plurality of second solder balls inserted into a portion of the blind holes with one end of the second solder balls protruding out from the surface of the second solder mask layer, wherein the second solder balls are electrically connected with both the first metallic layer and the second metallic layer, and portions of the second metallic layer are circularly embedded in the second solder balls; and
    at least one chip over the first side of the tape, wherein the chip connects electrically with various contact points on the tape.

15. The package of claim 14, wherein material constituting the dielectric layer includes polyimide.

16. The package of claim 14, wherein material constituting the first metallic layer and the second metallic layer includes copper.

17. The package of claim 14, wherein the upper surface and the lower surface of the first metallic layer as well as the upper surface of the second metallic layer further include metallic alloy layers.

18. The package of claim 17, wherein material constituting the metallic alloy layer includes nickel-gold or lead-tin alloy.

19. The package of claim 14, wherein the chip has an active surface and a back surface, and the active surface of the chip further includes a plurality of bonding pads.

20. The package of claim 19, wherein the package further includes a plurality of conductive wires and packaging material, wherein the backside of the chip is attached to the first solder mask layer, the conductive wires connect the bonding pads with corresponding contact points on the tape, and the packaging material encloses the chip, the conductive wires and the contact points.

21. The package of claim 19, wherein the chip further includes a plurality of bumps protruding from the bonding pads, and the bumps correspond in position to various contact points.

22. The package of claim 21, wherein the package further includes underfilling material that encloses the banding pads, the bumps and the contact points.

23. The package of claim 21, wherein the package further includes a stiffener on the first solder mask layer and surrounds the chip.

24. The package of claim 20, wherein the package further includes a stiffener on the first solder mask layer surrounding the packaging material.

25. A tape for forming a tape ball grid array package, comprising:
   a dielectric layer having a first side, a second side and a plurality of via holes that pass through the dielectric layer;
   a patterned first metallic layer over the first side of the dielectric layer such that one end of the via boles is closed to form a plurality of blind holes;
   a patterned second metallic layer over the second side of the dielectric layer exposing the open end of the blind holes; and
   a plurality of solder balls inserted into the blind holes respectively with one end of the solder balls protruding out from the surface of the second metallic layer, wherein the solder balls and the first metallic layer are electrically connected, while at least one solder ball and the second metallic layer are electrically connected such that portions of the second metallic layer are circularly embedded in the solder ball.

26. The tape of claim 25, further comprising:
   a patterned first solder mask layer over the first metallic layer exposing a portion of the first metallic layer to serve as a plurality of contact points; and
   a patterned second solder mask layer over the second metallic layer exposing a portion of the second metallic layer and the open end of the blind holes.

27. The tape of claim 25, wherein material constituting the dielectric layer includes polyimide.

28. The tape of claim 25, wherein the first metallic layer serves as a signal transmission layer.

29. The tape of claim 25, wherein the second metallic layer serves as a power source layer or a ground layer.

30. The tape of claim 25, wherein material constituting the first metallic layer and the second metallic layer includes copper.

31. The tape of claim 25, wherein the upper surface and the lower surface of the first metallic layer as well as the upper surface of the second metallic layer further include metallic alloy layers.

32. The tape of claim 31, wherein material constituting the metallic alloy layer includes nickel-gold or lead-tin alloy.

33. A tape for forming a tape bill grid array package, comprising:
   a dielectric layer having a first side, a second side and a plurality of via holes that pass through the dielectric layer;
   a patterned first metallic layer over the first side of the dielectric layer such that one end of the via holes is closed to form a plurality of blind holes, wherein the first metallic layer serves as a signal transmission layer;
   a patterned second metallic layer over the second side of the dielectric layer exposing the open end of the blind holes, wherein the second metallic layer serves as a power source layer or a ground layer;
   a plurality of signal solder balls inserted into a portion of the blind holes respectively with one end of the signal solder balls protruding out from the surface of the second metallic layer, wherein the signal solder balls are electrically connected with the first metallic layer; and
   a plurality of power solder balls or ground solder balls inserted into a portion of the blind holes respectively with one end of the power or ground solder balls protruding out from the surface of the second metallic layer, wherein the power or ground solder balls are electrically connected with both the first metallic layer and the second metallic layer, and portions of the second metallic layer are circularly embedded in the power or ground solder balls.

34. The tape of claim 33, further comprising:
   a patterned first solder mask layer over the first metallic layer exposing a portion of the first metallic layer to serve as a plurality of contact points; and
   a patterned second solder mask layer over the second metallic layer exposing a portion of the second metallic layer and the open end of the blind holes.

35. The tape of claim 33, wherein material constituting the dielectric layer includes polyimide.

36. The tape of claim 33, wherein material constituting the first metallic layer and the second metallic layer includes copper.

37. The tape of claim 33, wherein the upper surface and the lower surface of the first metallic layer as well as the upper surface of the second metallic layer further include metallic alloy layers.

38. The tape of claim 37, wherein material constituting the metallic alloy layer includes nickel-gold or lead-tin alloy.

* * * * *